United States Patent [19]

Shirato et al.

[11] Patent Number: 4,914,503
[45] Date of Patent: Apr. 3, 1990

[54] SEMICONDUCTOR DEVICE

[75] Inventors: Takehide Shirato, Hiratsuka; Teruo Tazunoki, Kawasaki, both of Japan

[73] Assignee: Fujitsu Limited, Kawasaki, Japan

[21] Appl. No.: 84,056

[22] Filed: Aug. 11, 1987

[30] Foreign Application Priority Data

Aug. 12, 1986 [JP] Japan .................. 61-189095

[51] Int. Cl.⁴ ................ H01L 23/52; H01L 21/60
[52] U.S. Cl. ................................ 357/71; 357/68
[58] Field of Search .................... 357/68, 71, 80, 67

[56] References Cited

U.S. PATENT DOCUMENTS

| | | | |
|---|---|---|---|
| 4,500,906 | 2/1985 | Ohno et al. | 357/71 |
| 4,511,914 | 4/1985 | Remedi et al. | 357/68 |
| 4,628,343 | 12/1986 | Komatsu | 357/68 |
| 4,654,689 | 3/1987 | Fujii | 357/68 |
| 4,809,046 | 2/1989 | Aoyama et al. | 357/71 |

FOREIGN PATENT DOCUMENTS

| | | |
|---|---|---|
| 0170268 | 5/1986 | European Pat. Off. . |
| 121250 | 3/1982 | Japan . |
| 33864 | 7/1983 | Japan . |
| 135747 | 4/1984 | Japan . |
| 169166 | 10/1984 | Japan . |

Primary Examiner—Rolf Hille
Assistant Examiner—S. V. Clark
Attorney, Agent, or Firm—Armstrong, Nikaido, Marmelstein, Kubovcik & Murray

[57] ABSTRACT

A semiconductor device comprises a semiconductor chip having main power supply lines which are arranged in peripheral regions in the vicinity of edges of the semiconductor chip and which are formed with multi-level metallization. The main power supply lines are formed with arrangements in that layers of the same potential face each other through an insulating layer in chip corner regions adjacent to corners of the semiconductor chip.

11 Claims, 7 Drawing Sheets

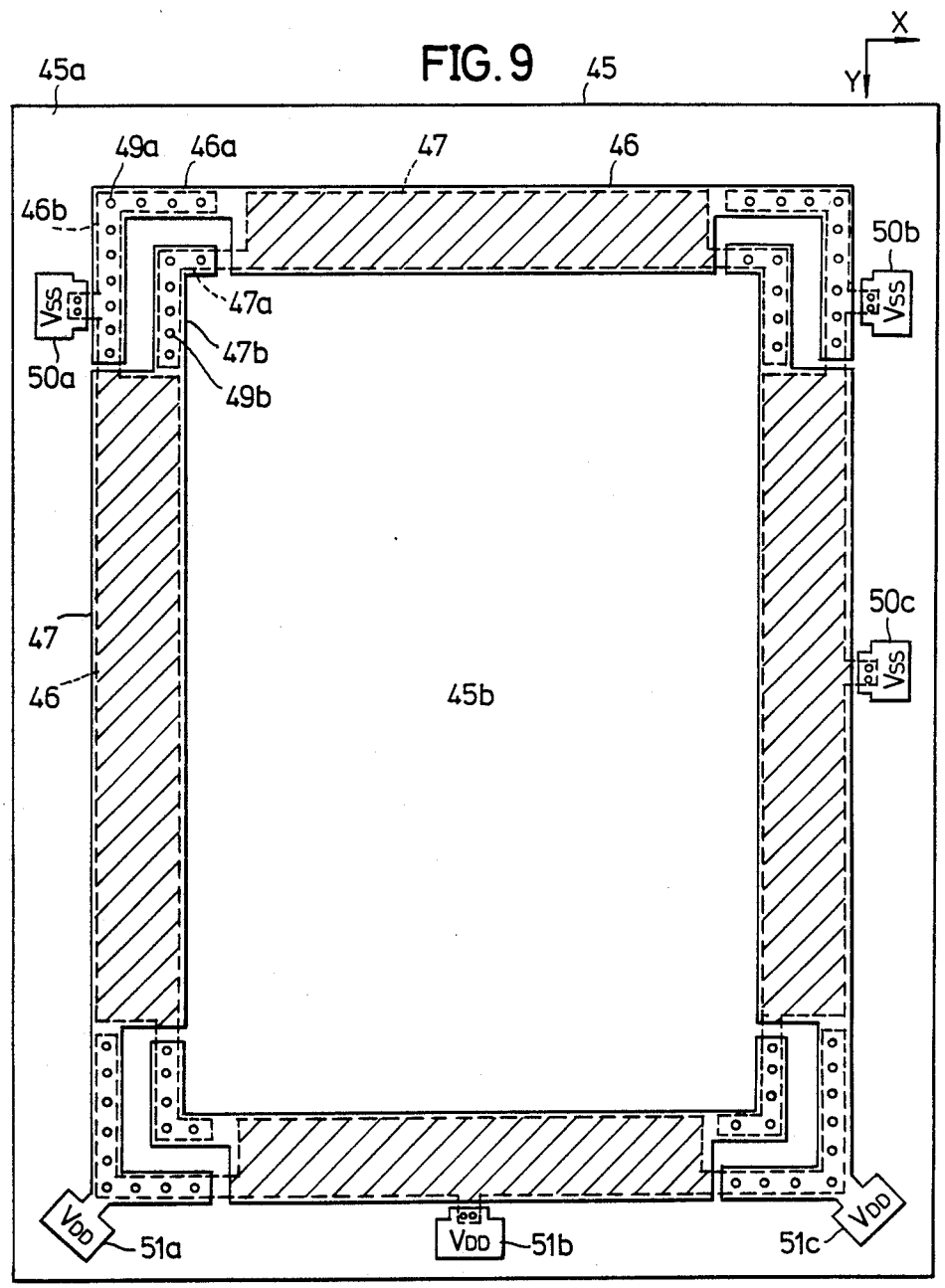

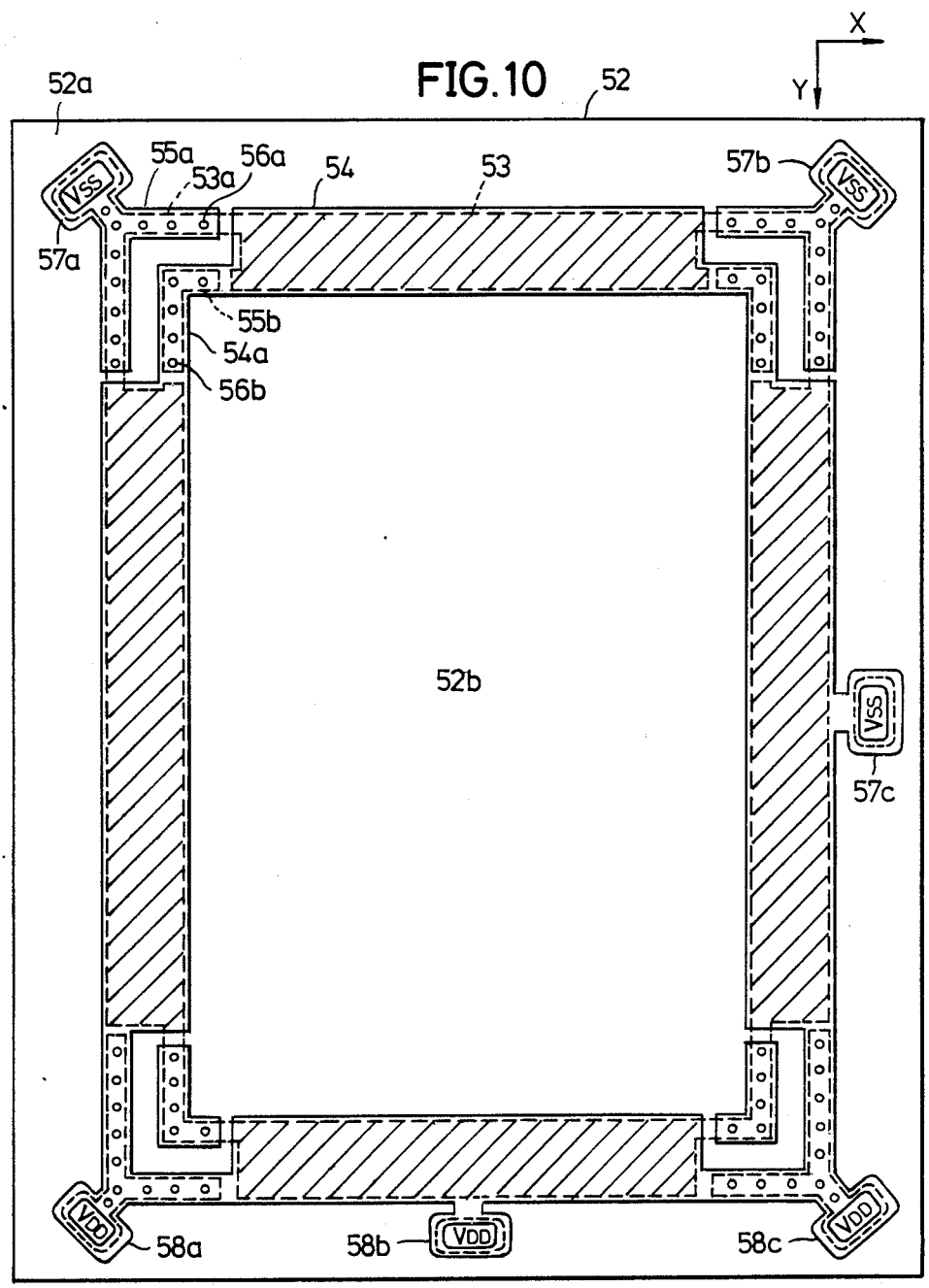

SEMICONDUCTOR DEVICE

BACKGROUND OF THE INVENTION

The present invention generally relates to a semiconductor device, and in particular to a semiconductor device in which a plurality of power supply lines are formed so as to be concentric in chip peripheral regions on an integrated-circuit chip in a semiconductor device by means of a multi-layer interconnection.

In a semiconductor device such as an integrated circuit, the area for interconnection or metallization in an integrated-circuit chip increases, as the integration density of a semiconductor device increases. Therefore, a multi-layer interconnection is widely employed to enhance the integration density of the semiconductor device. Generally, the multi-layer interconnection is carried out not only for interconnection between cells formed on the chip, but also for power supply lines for supplying the cells with electric power served from an external poewr source. In particular, when the power supply lines are formed according to the multi-layer metallization, the power supply lines are arranged so as to be concentric in chip peripheral regions on the chip. This is because the use of the concentric power supply lines makes it possible to reduce the number of power terminal pads which are formed in the chip peripheral regions. In addition, it is possible to make the length of branch power lines extending from the concentric power supply lines to the cells formed in internal circuit regions short. In other words, if the power supply lines are made up of a plurality of separated line pieces, it becomes necessary to mount many power terminal pads on the chip and also to extend relatively long branch power lines to the cells in the internal circuit regions surrounded by the concentric power lines.

The chip aforementioned is generally packaged to protect it from external environments. As well known, plastic molding seal is widely used as one of packaging means of the chip. When sealing the chip with plastics, attention must be paid to thermal expansion coefficients of the chip and plastics. In detail, the thermal expansion coefficients of the chip and plastics are approximately $3 \times 10^{-6}$ C.$^{-1}$ and $2 \times 10^{-5}$ C.$^{-1}$, respectively. That is, the thermal expansion coefficient of plastics is much larger than that of the chip. Therefore, the difference in the thermal expansion coefficients causes mechanical stress as a function of temperature in the plastic molded semiconductor device. In particular, when the mechanical stress exceeds a certain magnitude, cracks are generated in the chip. The cracks frequently cause disconnection of power lines on the chip. The cracks also lead to short-circuiting between the power lines, especially when moisture enters into the cracks. It should be noted that the mechanical stress is greatest in corner regions of the chip in the plastic molded semiconductor device, compared with the internal circuit regions of the chip in which many cells are arranged. That is, the longer the distance from the center of the chip, the larger the magnitude of the mechanical stress. Therefore, the disconnection and/or short-circuit in the power lines are frequently brought about in the chip corner regions.

Strain buffer material or plastic of a low thermal expansion coefficient which is nearly equal to that of the chip is now being investigated in order to suppress the generation of the cracks resulting from the difference in the thermal expansion coefficients. However, currently it is impossible to perfectly suppress the generation of the cracks.

SUMMARY OF THE INVENTION

Accordingly, it is a general object of the present invention to provide a novel and effective semiconductor device, in which the above described problems have been eliminated.

Another and more specific object of the present invention is to provide a semiconductor device, in which occurrence of disconnection and/or short-circuit in power lines can be prevented, even if cracks resulting from the difference between the thermal expansion coefficients of the chip and plastic are generated. In order to achieve this object, a semiconductor device of the present invention comprises a semiconductor chip having main power supply lines which are arranged in peripheral regions in the vicinity of edges of the semiconductor chip, the main power lines being formed with layers of multi-levels between which an insulating layer is interposed, each of the main power lines being formed with arrangements in that layers of the same potential face each other through the insulating layer in chip corner regions adjacent to corners of the semiconductor chip; and a package made of plastic for sealing the semiconductor chip.

Other objects and further features of the present invention will be apparent from the following detailed description when read in conjunction with the attached drawings.

BRIEF DESCRIPTION OF THE DRAWINGS

FIG. 9 is a plan view of a second embodiment according to the present invention; and FIG. 10 is a plan view of a third embodiment according to the present invention.

DETAILED DESCRIPTION

Figure 1:
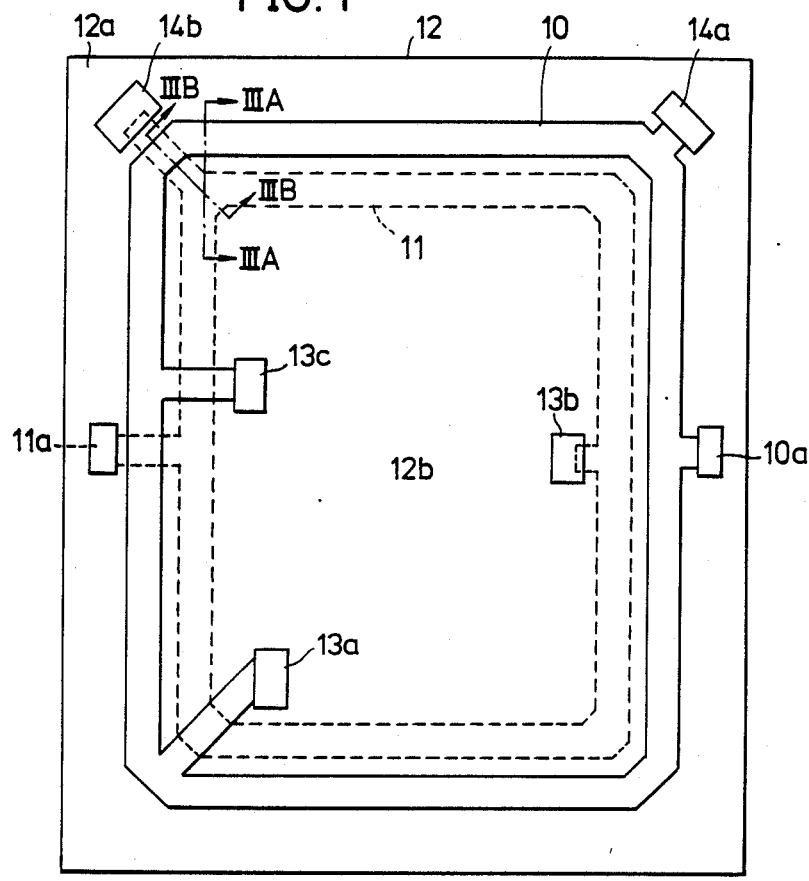
FIG. 1 is a plan view of a chip in a conventional semiconductor device.

Description will first be given of a conventional semiconductor device having concentric power supply lines to ensure a better understanding of the present invention which will be described in detail later.

Referring to FIGS. 1, 2, 3(A) and 3(B), there are provided concentric power supply lines 10 and 11 which are formed so as to be concentric in chip peripheral regions on a chip 12. Chip peripheral regions are defined as chip regions in the vicinity of edges of the chip 12. The power line 11 is formed by a layer made of metallic material such as aluminum, which is deposited on an insulating layer 17. Of course, the insulating layer 17 is deposited on a semiconductor substrate (not shown) in the device. On the power line 11 and the insulating layer 17, there is deposited another insulating layer 18. The power line 10, which is formed with a layer made of metallic material such as aluminum, is deposited on the insulating layer 18. The power line 10 and the insulating layer 18 are covered with a cover layer 19 made of PSG, for example. Finally, the chip 12 is sealed with a plastic layer 15.

The power line 10 is arranged outside the power line 11, as shown in FIG. 1. In relation to the power lines 10 and 11, there are provided power terminal pads 10a and 11a to which electric power fed by an external power source is respectively applied. The pads 10a and 11a are located in the chip peripheral regions on the chip 12, as shown in FIG. 1. The electric potential of the power lines 10 and 11 are different from each other. The power line 10 supplies cells 13a and 13c with the power. These cells are arranged in an internal integrated-circuit region 12b which is defined as a region surrounded by the concentric power lines 10 and 11. Similarly, the power line 11 supplies the power for a cell 13b. In this arrangement, it should be noted that branch power lines extending from the power line 10 to the cells 13a and 13c cross over the power line 11, on which the insulating layer 17 is deposited. Also, a branch power line extending from the power line 11 to the pad 11a passes under the power line 10 which is deposited on the insulating layer 18. As will be described later, the crossing of the power lines of different potential, especially in the chip corner regions, increases the probability of short-circuits therein.

The power lines 10 and 11 also supply circuits or components arranged in the chip peripheral regions with the power. For example, there are provided many monitor transistors and other components for conducting tests such as a reliability test in chip corner regions 12a of the chip, which means regions in the vicinity of the corners of the chip. In addition, in the chip corner regions, there are provided power terminal pads 14a and 14b for tests, as shown in FIG. 1. This is because the cells arranged in the internal integrated-circuit region 12b on the chip are prevented from being damaged upon tests. The pads 14a and 14b for tests are connected to the power lines 10 and 11, respectively. It should be noted that in this arrangement, a branch power line extending from the power line 11 to the pad 14b for tests passes under the power line 10 which is deposited on the insulating layer 18. The crossing of the power lines of different potential increases the probability of short-circuits therein.

Figure 2:
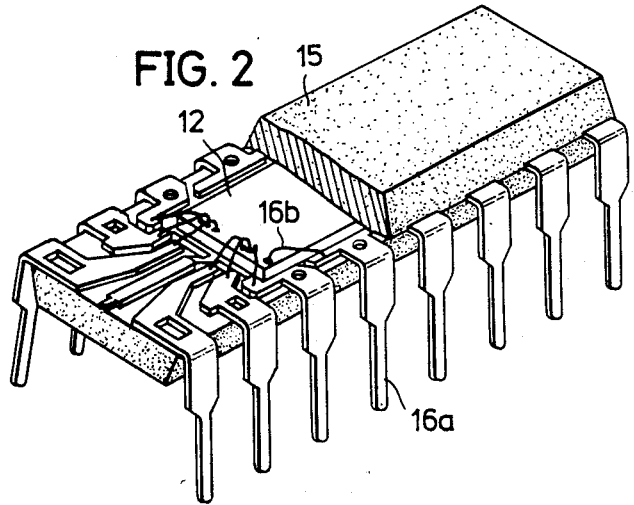
FIG. 2 is a partially cut-away perspective view in respective of a plastic package type semiconductor device.
Figure 3A:
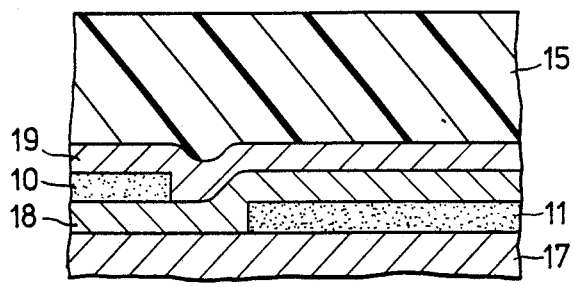
FIG. 3(A) is a cross sectional view of the chip along a line III$_A$—III$_A$ in FIG. 1.
Figure 3B:
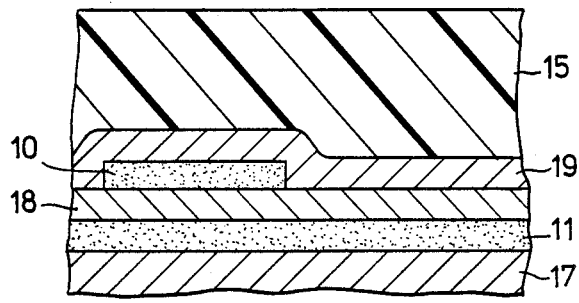
FIG. 3(B) is a cross sectional view of the chip along a line III$_B$—III$_B$ in FIG. 1.

As shown in FIG. 2, the chip 12 is sealed by plastic 15, to which dual-in-line leads 16a are attached. The connection between the pads on the chip 12 and the corresponding leads 16 is carried out by wire bonding. That is, the pads and the leads 16a are electrically connected with bonding wires 16b.

As described previously, when the chip is sealed with plastic by transfer molding method, as the temperature rises the mechanical stress is generated in the semiconductor device resulting from the difference between the thermal expansion coefficients of the chip and plastic. The mechanical stress causes cracks in the chip, leading to the disconnection and/or short-circuit of the power lines. Moreover, the problems are accentuated in the chip corner regions away from the center of the chip.

Figure 4:
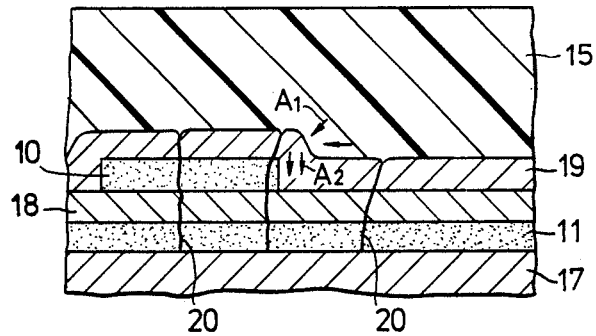
FIG. 4 is a cross sectional view of the chip along the line III$_B$—III$_B$ in FIG. 1, in a state where cracks are generated.

Let us consider the problems resulting from the mechanical stress which is caused by the difference between the thermal expansion coefficients of the chip and plastics. Since the thermal expansion coefficient of plastics is much larger than that of the chip, the plastic layer 15 tries to considerably expand as the temperature increases. Therefore, the stress in the direction of arrows $A_1$ is generated in the plastic layer 15, as shown in FIG. 4. Correspondingly, the stress in the direction of arrows $A_2$ is introduced in the cover layer 19. As a result, the stress in the cover layer 19 causes cracks 20, so that each of the deposited layers is divided into two or more parts, as shown in FIG. 4. Therefore, the power lines 10 and/or 11 would probably be disconnected. In addition, if moisture or the like enters the cracks, the power lines 10 and 11 become electrically connected to each other. Since the potential of the power line 10 is different from that of the power line 11, the short-circuit occurs between the power lines 10 and 11. Even if moisture or the like does not go into the cracks 20, the short-circuit may occur when the insulating layer 18 is destroyed due to the stress and thus the power line 10 directly makes contact with the power line 11. It should be noted that these problems are accentuated on the chip corner regions, rather than the chip center region, as described in the foregoing.

The present invention mainly provides a semiconductor device in which the disconnection and/or short-circuit in chip corner regions can be avoided, even when cracks are generated in the chip.

Description will now be given of a first embodiment of a semiconductor device according to the present invention with reference to FIGS. 5, 6(A) and 6(B).

On an insulating layer 22 in a chip 21 of a semiconductor device, there are deposited a first lower line layer 23 extending in the X direction, and a second lower line layer 24 extending in the Y direction. Of course, the insulating layer 22 is deposited on a semiconductor substrate (not shown). The first and second lower layers 23 and 24 are made of metallic material such as aluminum. The first lower layer 23 forms a $V_{SS}$ power supply line of a potential $V_{SS}$ value in the X direction, while the second lower layer 24 forms a $V_{DD}$ power supply line of a potential $V_{DD}$ value in the Y direction. The first lower layer 23 has a substantially L-shaped part or pattern 23a in a chip corner region 21a and its vicinity. The L-shaped part 23a of the first lower layer 23 is narrower than its body part. Similarly, the second lower layer 24 has a substantially L-shaped part 24a in the chip corner region 21a and its vicinity. The L-shaped part 24a of the second lower layer 24 is narrower than its body part. The L-shaped part 23a is arranged outside the L-shaped part 24a. An insulating layer 25 is deposited on the first and second lower layers 23 and 24 as well as the insulating layer 22.

A first upper line layer 26 extending in the X direction is deposited on the insulating layer 25 so as to be laid over the first lower layer 23. This layer is made of metallic material such as aluminum. The first upper layer 26 forms a $V_{DD}$ power supply line of the potential $V_{DD}$ in the X direction. The width of the first upper layer 26 is almost the same as that of the first lower layer 23 in the chip peripheral region other than the chip corner region 21a and its vicinity. The first upper layer 26 has a substantially L-shaped part 26a, which is narrower than its body part. As shown in FIG. 5, the L-shaped part 26a of the first upper layer 26 is deposited on the insulating layer 25 so as to be laid over the L-shaped part 24a of the second lower layer 24. In other words, the L-shaped parts 24a and 26a are positioned to face each other through the insulating layer 25. The width of the L-shaped part 26a is almost the same as that of the L-shaped part 24a. A part of the insulating layer 25 which is sandwiched by the L-shaped parts 24a and 26a has a plurality of through holes 28a in the perpendicular direction. Aluminum or the like is filled into the through holes 28a upon depositing the first upper layer 26. Therefore, the first upper layer 26 and the second lower layer 24 are electrically connected to each other.

A second upper layer 27 extending in the Y direction is deposited on the insulating layer 25 so as to be laid over the second lower layer 24. The layer 27 is also made of metallic material. The second upper layer 27 forms a $V_{SS}$ power supply line of the potential $V_{SS}$ in the Y direction. The width of the second upper layer 27 is almost the same as that of the second lower layer 24. The second upper layer 27 has a L-shaped part 27a in the chip corner region 21a and its vicinity. The L-shaped part 27a of the second upper layer 27 is narrower than its body part. The L-shaped part 27a is deposited on the insulating layer 25 to be laid over the L-shaped part 23a. In other words, the L-shaped parts 23a and 27a are positioned so as to face each other through the insulating layer 25. The L-shaped part 27a is also laid over an island part 23b made of metallic material, which is simultaneously deposited upon the deposition process of the lower layers. A part of the insulating layer 25 which a sandwiched by the L-shaped parts 23a and 27a has a plurality of through holes 28b in the perpendicular direction. Also, a part of the insulating layer 25 which is sandwiched by the island part 23b and the L-shaped part 27a has a plurality of through holes 28c. The through holes 28b and 28c are filled with metallic material upon depositing the second upper layer 27. Therefore, the second upper layer 27 is electrically connected to the first lower layery 23.

A branch power line 24b integrally extends from the L-shaped part 24a of the second lower layer 24. The branch linen 24b passes under the L-shaped part 27a of the second upper layer 27 and is electrically connected to a power pad 30 for tests which is located in the chip peripheral region. The branch line 24b and the pad 30 are positioned away from the chip corner part 21a. It should be noted that in the conventional device in FIG. 1, the branch extending to the pad 14b for tests passes under the power line 10 in the chip corner region 12a, while in FIG. 5, the branch line 24b reaching to the pad 30 for tests passes under the L-shaped part 27a and reaches the pad 30 located at a distance from the chip corner region 21a.

The cover layer 19 is deposited over the first and second upper layers 26 and 27 and the insulating layer 25. Further, the plastic layer 15 seals the chip 21 aforementioned.

Figure 7:
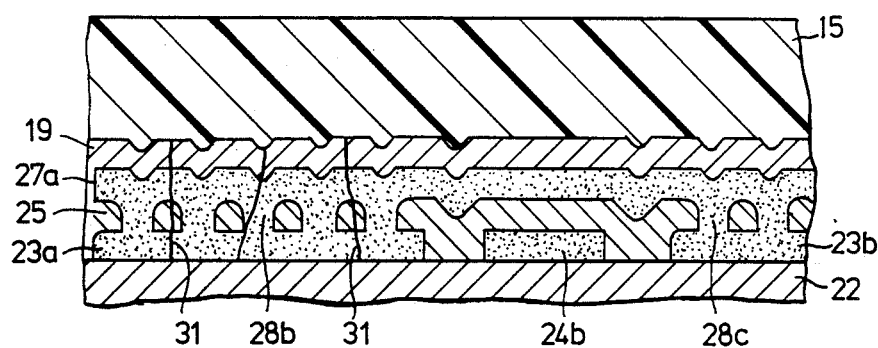
FIG. 7 is a cross sectional view along the line VI$_A$—VI$_A$ in FIG. 5 in a state where cracks are generated.

It will easily be understood from the above description tha the $V_{SS}$ and $V_{DD}$ power lines in the other chip corner regions and their vicinity are formed in the similar manner to those in the chip corner region 21a and its vicinity. Consequently, the $V_{SS}$ and $V_{DD}$ lines are formed to be concentric in the chip peripheral regions in such a manner that the layers of the same potential are arranged to face each other through the insulating layer in the chip corner regions and their vicinity and are mutually connected by means of conductor filled into the through holes in the insulating layer, while the layers of the different potential are arranged to be opposite to each other through the insulating layer in the regions other than the chip corner regions and their vicinity. In an internal integrated-circuit region 21b, there are arranged cells. Consequently, as shown in FIG. 7, even when cracks 31 are generated in the deposited layers in the chip corner region 21a, the short-circuit between the lines of the different potential can never occur. In addition, it is possible to prevent the disconnection from generating in the power lines in the chip corner region 21a.

In the first embodiment aforementioned, the layers of the same potential are laid to face each other through the insulating layer not only in the chip corner regions such as the region 21a but also in their vicinity. This is why the cracks sometimes generate even in the regions in the vicinity of the chip corner regions. Therefore, the first embodiment makes it possible to avoid the disconnection and/or short-circuit which is generated not only in the chip corner regions but also in their vicinity, so that a high reliability of the semiconductor device according to the first embodiment can be achieved. Of course, it is possible to design the power lines in such a manner that layers of the same potential are laid to face each other through the insulating layer only in the chip corner regions, in which the generation of the cracks is accenturated over other regions in the chip. Also, it is possible to employ line patterns in the chip corner regions such as arc instead of the L-shaped form.

Figure 5:
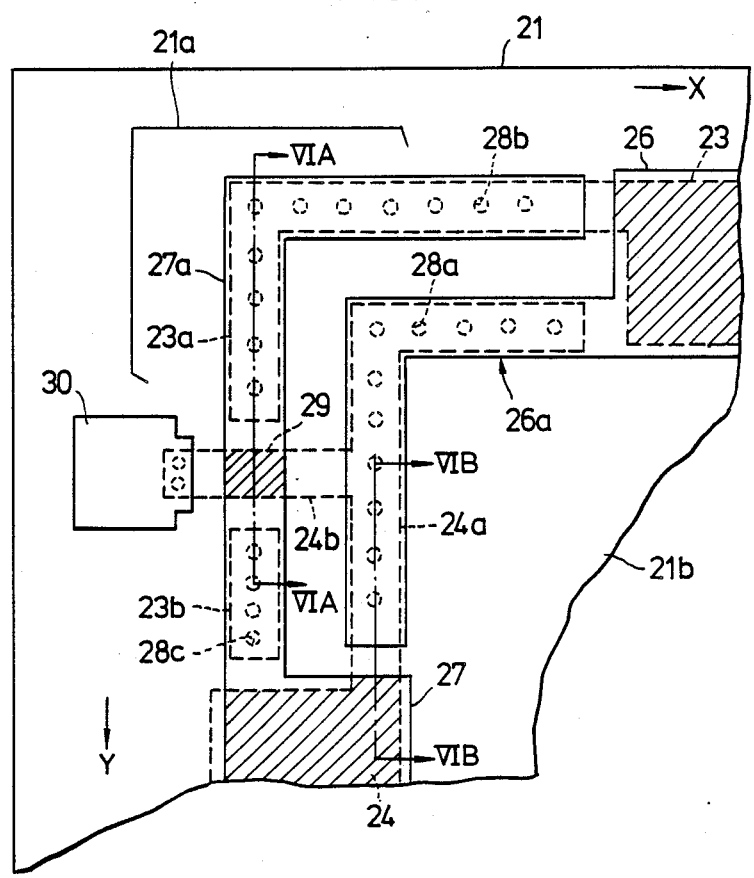
FIG. 5 is a plan view showing essential parts of a semiconductor device of a first embodiment according to the present invention.
Figure 6A:
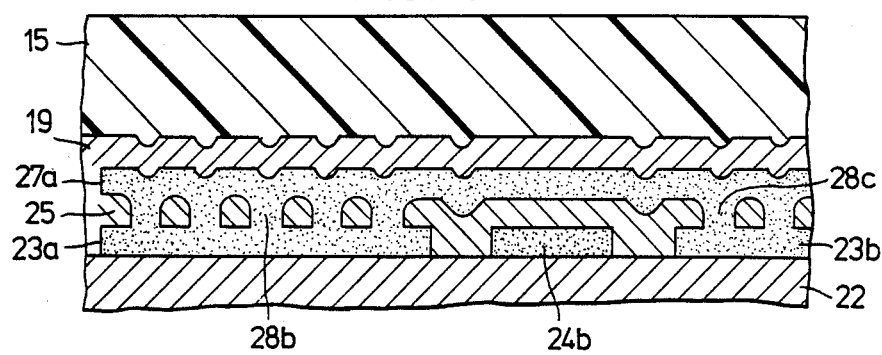
FIG. 6(A) is a cross sectional view along a line VI$_A$—VI$_A$ in FIG. 5.
Figure 6B:
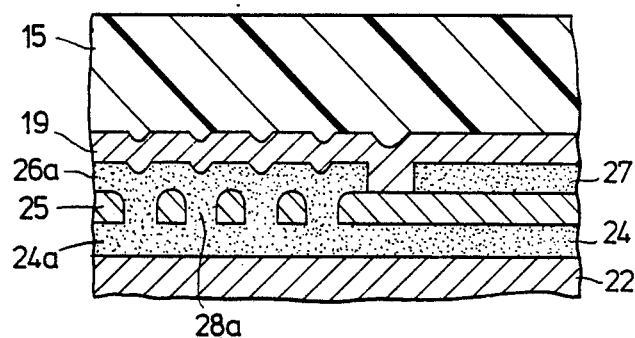
FIG. 6(B) is a cross sectional view along a line VI$_B$—VI$_B$ in FIG. 5.

The width of the L-shaped patterns 23a, 24a, 26a and 27a is less than the half of that of their body parts, as shown in FIG. 5, in order to keep the integration density high. In addition, it is possible to ensure a nominal current density of the power lines, because the L-shaped parts of the same potential are connected to each other by means of the metallic material filled into the through holes 28a and 28b.

Also, a cross part 29 of the $V_{SS}$ and $V_{DD}$ lines is designed so as to remain remote from the chip corner region 21a. Therefore, the possibility of the short-circuit occurring in the cross part 29 is relatively small, compared with the conventional device in FIG. 1. Moreover, it should be noted the area of the cross part 29 is very small, because the L-shaped part 23a of the power line 23 is narrower than its body part. Consequently, the possibility on occurrence of the short-circuit is considerably lower, compared with the conventional arrangement of the power lines.

Figure 8:
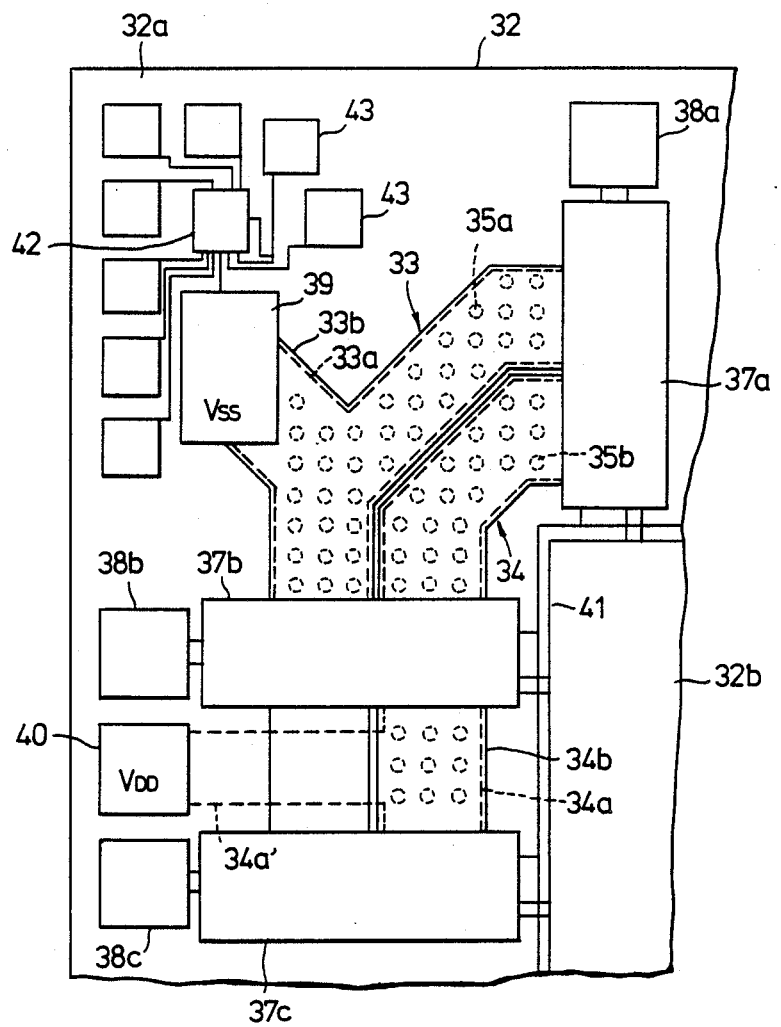
FIG. 8 is a plan view of one example of a semiconductor device according to the present invention wherein peripheral components are arranged in relation to power lines.

FIG. 8 illustrates one example of a detailed arrangement in a chip corner region and its vicinity in a semiconductor device according to the present invention. In a chip corner region 32a and its vicinity of a chip 32, there are provided a $V_{SS}$ power supply line 33 and a $V_{DD}$ power supply line 34. The $V_{SS}$ power line 33 is made up of a lower layer 33a which is illustrated with broken lines and an upper layer 31b which is illustrated with solid lines. Of course, an insulating layer (not shown) is interposed between the lower and upper layers 33a and 33b. The lower layer 33a has substantially the same width as the upper layer 33b. The upper layer 33b is deposited on the insulating layer so as to be laid over the lower layer 33a. The insulating layer which is sandwiched between the lower and upper layers 33a and 33b has a plurality of through holes 35a. The upper layer 33b is electrically connected with the lower layer 33a by means of metallic material such as aluminum which is filled into the through holes 35a upon the depositing process of the upper layer 33b. Similarly, the $V_{DD}$ power line 34 is made up of a lower layer 34a and an upper layer 34b, which are substantially the same width as each other. Also, the insulating layer is interposed between the lower layer 34a and upper layer 34b. The upper layer 34b is deposited on the insulating layer so as to be laid over the lower layer 34a. The insulating layer has a plurality of through holes 35b into which metallic material is filled. Therefore, the upper layer 34b is electrically connected to the lower layer 34a. Input/output cells (hereinafter referred to as I/O cells) 37a, 37b and 37c are formed at either of the lower or upper metallization levels. Power terminal pads 38a, 38b and 38c are provided in relation to the I/O cells 37a, 37b and 37c as shown in FIG. 8. Signal lines 41 extend from the I/O cells toward cells (not shown) which are formed in an internal integrated-circuit region 32b of the chip 32. A power terminal pad 39 for tests which is located in the chip corner region 32a is connected to the $V_{SS}$ power line 33. A monitor transistor 42 for tests and its pads 43 are formed in the vicinity of the pad 39. A power pad 40 which is located at a distance from the chip corner region 32a, is connected to the $V_{DD}$ power line 34 with a branch line 34a' extending from its lower layer 34a.

Description will now be given of a second embodiment of a semiconductor device according to the present invention with reference to FIG. 9. One of essential features of the second embodiment is that a $V_{SS}$ power line extending in the X direction is formed with an upper line layer, while the $V_{SS}$ power line in the Y direction is formed with a lower layer. Of course, in chip corner regions and their vicinity, the upper layer is deposited on an insulating layer so as to be laid over the lower layer of the same potential as the upper layer.

Referring to FIG. 9, in the X direction of a chip 45, a $V_{SS}$ power supply line 46 is deposited on an insulating layer (not shown) so as to be laid over a $V_{DD}$ power supply line 47. On the contrary, in the Y direction, the $V_{DD}$ power line 47 is deposited on the insulating layer so as to be laid over the $V_{SS}$ power line 46. In each of chip corner regions of the chip 45 and their vicinity, the power lines are formed in such a manner that the upper layer is deposited on the insulating layer to be laid over the lower layer of the same potential as the upper layer. For example, in a chip corner region 45a and its vicinity, a L-shaped part 46a of the $V_{SS}$ line 46 in the X direction is deposited on the insulating layer to be laid over a L-shaped part 46b of the potential $V_{SS}$. The L-shaped part 46a is connected to the L-shaped part 46b with metallic material filled into through holes 49a formed in the insulating later. Similarly, a L-shaped part 47b of the $V_{DD}$ line 47 in the Y direction is deposited to be laid over a L-shaped part 47a of the $V_{DD}$ power line 47 in the Y direction. The upper and lower L-shaped parts 47a and 47b are electrically connected to each other by means of metallic material filled into through holes formed the insulating layer. Power pads 50a, 50b and 50c for the $V_{SS}$ power line 46 are provided at the upper layer level, as shown in FIG. 9. Also, power pads 51a, 51b and 51c for the $V_{DD}$ power line 47 are provided at the upper layer level, as shown in FIG. 9. Cells are arranged in an internal integrated-circuit region 45b. Therefore, the arrangement of the second embodiment makes it possible not only to prevent the occurrence of disconnection and/or short-circuit in the power lines resulting from the difference between the thermal expansion coefficients of the plastic layer and the chip, but also to design the arrangement of circuit patterns with flexibility.

FIG. 10 illustrates a third embodiment of a semiconductor device according to the present invention. One of the essential features of the third embodiment is in that a $V_{SS}$ power line in formed with a lower line layer and a $V_{DD}$ power line is formed with an upper line layer. Referring to FIG. 10, a $V_{SS}$ power supply line 53 in a chip 52 in both the X and Y directions is formed with a lower line layer, and a $V_{DD}$ power supply line 54 in both the X and Y directions is formed with an upper line layer. The upper and lower layers of the different potential are mutually separated by an insulating layer (not shown) in chip regions other than chip corner regions and their vicinity. In the chip corner regions and their vicinity, the upper and lower layer of the same potential are separated by the insulating layer. For example, in a chip corner region 52a, a substantially L-shaped layer 55a is disposed on the insulating layer to be laid over a substantially L-shaped part 53a of the $V_{SS}$ power supply line 53. Of course, the layer 55a and the part 53a are electrically connected to each other by means of metallic material which is filled into through holes 56a in the insulating layer. In this arrangement, the upper L-shaped layer 55a is intended to ensure the nominal current density. Similarly, a corner part 54a of the $V_{DD}$ power line 54 is arranged to be laid over a substantially L-shaped layer 55b. Of course, the layer 55b and the part 54a are electrically connected to each other by means of metallic material filled into through holes 56a formed in the insulating layer. Power terminal pads 57a, 57b and 57c for the $V_{SS}$ lines 53 are provided, as shown in FIG. 10. These pads are made up of the overlapped lower and upper layers which are electrically connected to each other. Similarly, there are provided power pads 58a, 58b and 58c for the $V_{DD}$ lines 54. Also, these pads are formed with the overlapped lower and upper layers which are electrically connected to each other. Cells are arranged in an internal integrated-circuit region 52b. The third embodiment thus formed also makes it possible not only to prevent occurrence of disconnection and/or short-circuit of the power lines but also to design circuit patterns with flexibility.

Although the embodiments discussed in the foregoing are examples of the semiconductor device of two-level metallization, it will be apparent from the above description that the present invention includes semiconductor devices of three or more level of metallization.

The present invention is not limited to the embodiments, but various variation and modification may be made without departing from the scope of the present invention.

What is claimed is:

1. A semiconductor device comprising: a semiconductor chip having main power supply lines which are arranged in peripheral regions in the vicinity of edges of said semiconductor chip, said main power lines being formed with multi-level layers with a first insulating layer being interposed therebetween, said multi-level layers being formed on a second insulating layer provided on said semiconductor chip, each of said main power lines being formed with arrangements in that layers of the same potential face each other through said first insulating layer in chip corner regions adjacent to corners of said semiconductor chip; and
 a package made of plastics for sealing said semiconductor chip.

2. A semiconductor device as claimed in claim 1, wherein said layers of the same potential in said chip corner regions are electrically connected by means of metallic material which is filled into through holes formed in said insulating layer which is sandwiched between said layers of the same potential.

3. A semiconductor device as claimed in claim 1, wherein said layers of the same potential formed in said chip corner regions is narrower than other parts thereof in regions other than said chip corner regions.

4. A semiconductor device as claimed in claim 1, wherein in regions other than said chip corner regions, said main power lines are fomred with arrangements in that layers of different potential face each other through said insulating layer.

5. A semiconductor device as claimed in claim 1, wherein said main power supply lines are formed to be concentric in peripheral regions in the vicinity of edges of said semiconductor chip.

6. A semiconductor device comprising:
 a semiconductor chip sealed by a plastic material and having an intergrated circuit region and corner regions;
 a first main power supply line formed on said semiconductor chip and surrounding the intergrated circuit region, for supplying a first power source voltage to the integrated circuit region;
 an insulating layer for insulating said first main power supply line; and
 a second main power supply line formed on said semiconductor chip, for supplying a second power source voltage to said integrated circuit region, said second main power supply line being overlapped with said first main power supply line via said insulating layer in regions other than the corner regions and unoverlapped in said corner regions, and each of said first and second main power supply lines having a multi layer wiring structure in the corner regions.

7. A semiconductor device as claimed in claim 6, wherein said first and second main power supply lines have first width in the regions other than the corner regions and second width in the corner regions, which is smaller than the first width.

8. A semiconductor device as claimed in claim 7, wherein said second width is smaller than a half of the first width.

9. A semiconductor device comprising:
 a semiconductor chip, sealed by a plastic material, having an intergrated circuit, first, second, third and fourth edges, and first, second, third and fourth corners;
 a first wiring layer formed on said semiconductor chip;
 an insulating layer formed on said first wiring layer;
 a second wiring layer formed on said insulating layer; and
 first and second main power supply lines formed by said first and second wiring layers and arranged along the first, second, third and fourth edges for supplying power source voltages to the integrated circuit, said first and second main power supply lines being overlapped each other in regions other than said first, second, third and fourth corners.

10. A semiconductor device as claimed in claim 9, wherein said first main power supply line comprises a first portion formed by said first wiring layer and a second portion formed by second wiring layer at the first to fourth corners; and said second main power supply line comprises a first portion formed by said second wiring layer and a second portion formed by said first wiring layer at the first to fourth edges.

11. A semiconductor device as claimed in claim 9, wherein said first main power supply line comprises first and third portion formed by said first wiring layer and arranged along the first and second edges respectively, and second fourth portion formed by said second wiring layer and arranged along the second and fourth edges respectively, and each of the portions are connected each other at the first to fourth corners; and
 said second main power supply line comprises first and third portion formed by said second wiring layer and arranged along the first and second edges respectively; and second and fourth portion formed by said first wiring layer and arranged along the second and fourth edges respectively, and each of the portions are connected each other at the first to fourth corners.

* * * * *